United States Patent [19]

Giaquinto et al.

[11] Patent Number: 5,905,378

[45] Date of Patent: *May 18, 1999

[54] FLEXIBLE LIGHTWEIGHT ATTACHED PHASED-ARRAY (FLAP) RECEIVE COILS

[75] Inventors: Randy Otto Giaquinto, Burnt Hills; Charles Lucian Dumoulin, Ballston Lake, both of N.Y.

[73] Assignee: General Electric Company, Schenectady, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/799,922

[22] Filed: Feb. 13, 1997

[51] Int. Cl.$^6$ ........................................... G01V 3/00
[52] U.S. Cl. ................................. 324/318; 324/322
[58] Field of Search ....................... 324/318, 322, 324/314, 307, 309; 128/653.5

[56] References Cited

U.S. PATENT DOCUMENTS

| | | | |
|---|---|---|---|
| 4,791,372 | 12/1988 | Kirk et al. | 324/318 |
| 4,825,162 | 4/1989 | Roemer et al. | 324/318 |
| 4,920,318 | 4/1990 | Misic et al. | 324/318 |
| 5,435,302 | 7/1995 | Lenkinski et al. | 128/653.5 |
| 5,548,218 | 8/1996 | Lu | 324/318 |
| 5,617,027 | 4/1997 | Decke | 324/318 |

OTHER PUBLICATIONS

"MRI Basics and Coil Design Principles" by D.M. Peterson, G.R. Duensing, J.R. Fitzsimmons, pp. 56–64, RF Design, Jan. 1997.

*Primary Examiner*—Louis Arana
*Attorney, Agent, or Firm*—Marvin Snyder; Douglas E. Stoner

[57] ABSTRACT

One or more flexible magnetic Resonance (MR) receive coils are constructed of a flexible material and connected to a flexible base to produce a module. Each module has the coils overlapping by a predetermined amount to minimize coupling between the coils. The modules may be connected by attachment means placed at predefined locations to cause overlap of adjacent coils such that the coupling is minimized. Balanced-unbalanced ("baluns") may be used to couple each receive coil to its lead cable connecting it to the MR imaging electronics. The baluns effectively isolate the coils from the cables and each other to optimize signal-to-noise ratio of the received signal.

3 Claims, 3 Drawing Sheets

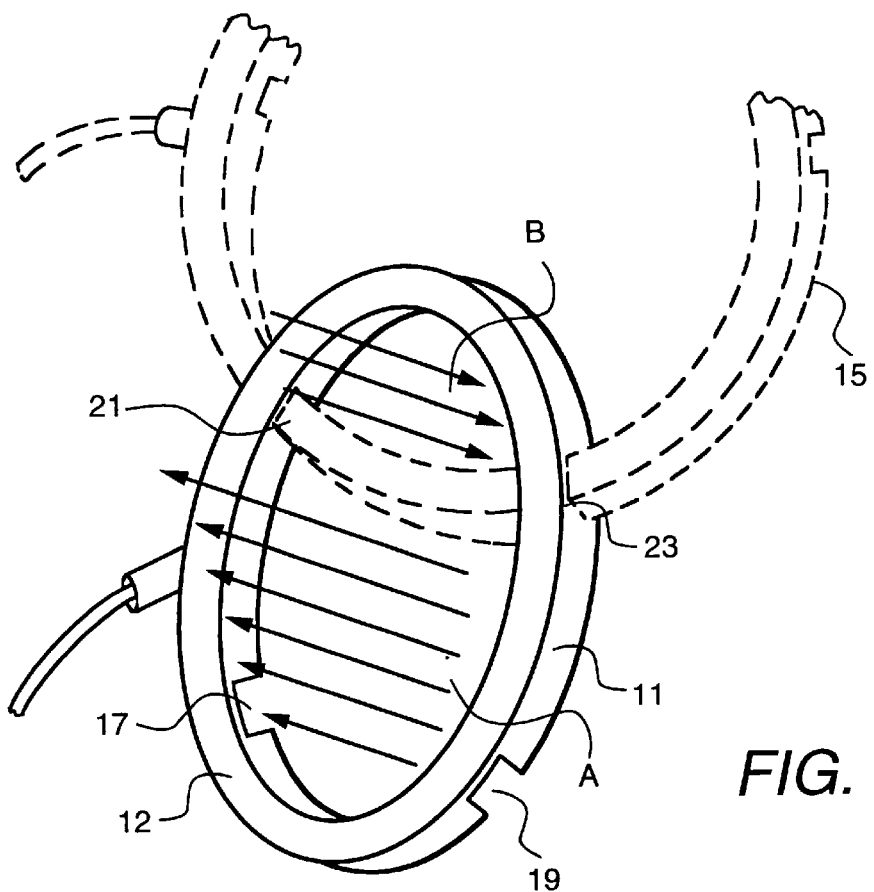
FIG. 3
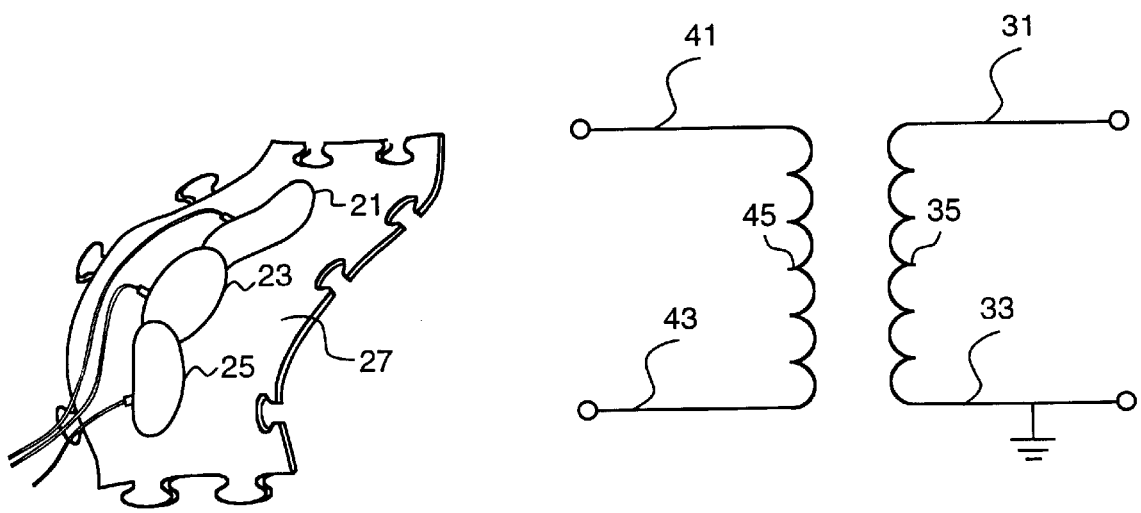
FIG. 4
FIG. 5

FLEXIBLE LIGHTWEIGHT ATTACHED PHASED-ARRAY (FLAP) RECEIVE COILS

BACKGROUND OF THE INVENTION

1. Field of Invention

The present invention corresponds to Magnetic Resonance Imaging (MRI) and more specifically to modular receive coils for MRI.

2. Discussion of Prior Art

Typically surface coils may be used in Magnetic Resonance (MR) Imaging to receive MR response signals for a region of a subject to create an MR image of that region.

Best results occur when the region imaged is at a depth from the surface coil being approximately the diameter of the surface coil. This provides a high signal/noise (S/N) ratio image. A disadvantage is that the field-of-view (FOV) tends to be small.

Several surface receive coils may be used, termed "phased array coils" to provide a larger FOV. Phased array coils are described in U. S. Pat. No. 4,825,162 Roemer, Edelstein "Nuclear Magnetic Resonance (NMR) Imaging with Multiple Surface Coils" issued Apr. 25, 1989, assigned to the present assignee and hereby incorporated by reference. Phased array coils must have predefined overlap between them in order to reduce coil "coupling" which reduces the S/N ratio, and are generally pre-constructed on a fixed surface. Since the degree of flux through each coil changes as the coils are distorted, they are also typically constructed on a non-flexible material.

The S/N ratio drops off as coils move away from the intended imaging volume, and the surface coils must be as close as possible to the surface of the subject. The use of phased array coils on rigid boards does not allow the coils to conform to the surface of the subject, resulting in a low S/N ratio image.

Also, different receive coils are used to image different parts of a subject. Head coils are typically used to image a subject's head and a body coil or flat surface coil typically are used to image a subject's back.

U. S. Pat. No. 5,435,302 "Flexible Surface Coils for Use in Nuclear Magnetic Resonance Imaging" by Lenkinski et al. issued Jul. 25, 1995 describes the use of a single flexible MR surface receive coil which conforms to the surface of the subject's face or neck. This, however, does not describe how to make coils to image different parts of a subject's anatomy, and also requires a special coil for imaging the neck as opposed to one used for imaging orbits of a subject's eyes.

Currently, there is a need for MR surface receive coils which have a large field of view, fit closely to surface of subject, have a large signal-to-noise ratio, and may be used to easily image different parts of subject.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

FIG. 3 is an illustration of the major elements of a receive coil module according to the present invention.

FIG. 4 is an illustration of another embodiment of receive coil module according to the present invention.

FIG. 5 is a schematic diagram of a general balanced to unbalanced lead matching circuit.

SUMMARY OF THE INVENTION

A modular Magnetic Resonance (MR) receive coil system is connected to an MR imaging system by lead cables. The receive coil system receives MR response signals from a subject which are used in producing high quality MR images.

The system includes a garment-like holder capable of fitting snugly to the surface of said subject.

At least one receive module is removeably attached to the holder by attachment means such as Velcro, clips, or snaps.

Each receive module has a flexible base and at least one conductive MR receive coil attached to the flexible base.

The flexible base may also have a plurality of attachment means for connecting other receive coil module such that there is a predetermined amount of overlap of the receive coils, minimizing coil interaction.

In an alternative embodiment, the modular MR receive coil system employs a balun attached between the receive coil and the lead cable for isolating the receive coil from the lead cable and other lead cables thereby reducing "coupling" between receive coils, and minimizing noise introduced by the lead cables.

In another embodiment, the modular MR receive coil employs a tuned balun attached between the receive coil and the lead cable for eliminating frequencies except for a narrow predefined desired frequency band.

This results in a modular receive coil system capable of high quality imaging for different regions of anatomy of a subject.

OBJECTS OF THE INVENTION

An object of the present invention is to provide surface coils which receive MR response signals from a large region to produce a high-quality MRI image with a large field-of-view.

Another object of the present invention is to provide adaptable, modular, MR imaging surface coils, capable of providing high-quality images of different portions of a subject.

Another object of the present invention is to provide a modular surface coil for MR imaging which conforms to the surface of the subject, holds itself in place for imaging, and may be used to image different regions of anatomy of a subject.

DETAILED DESCRIPTION OF THE INVENTION

Figure 1:
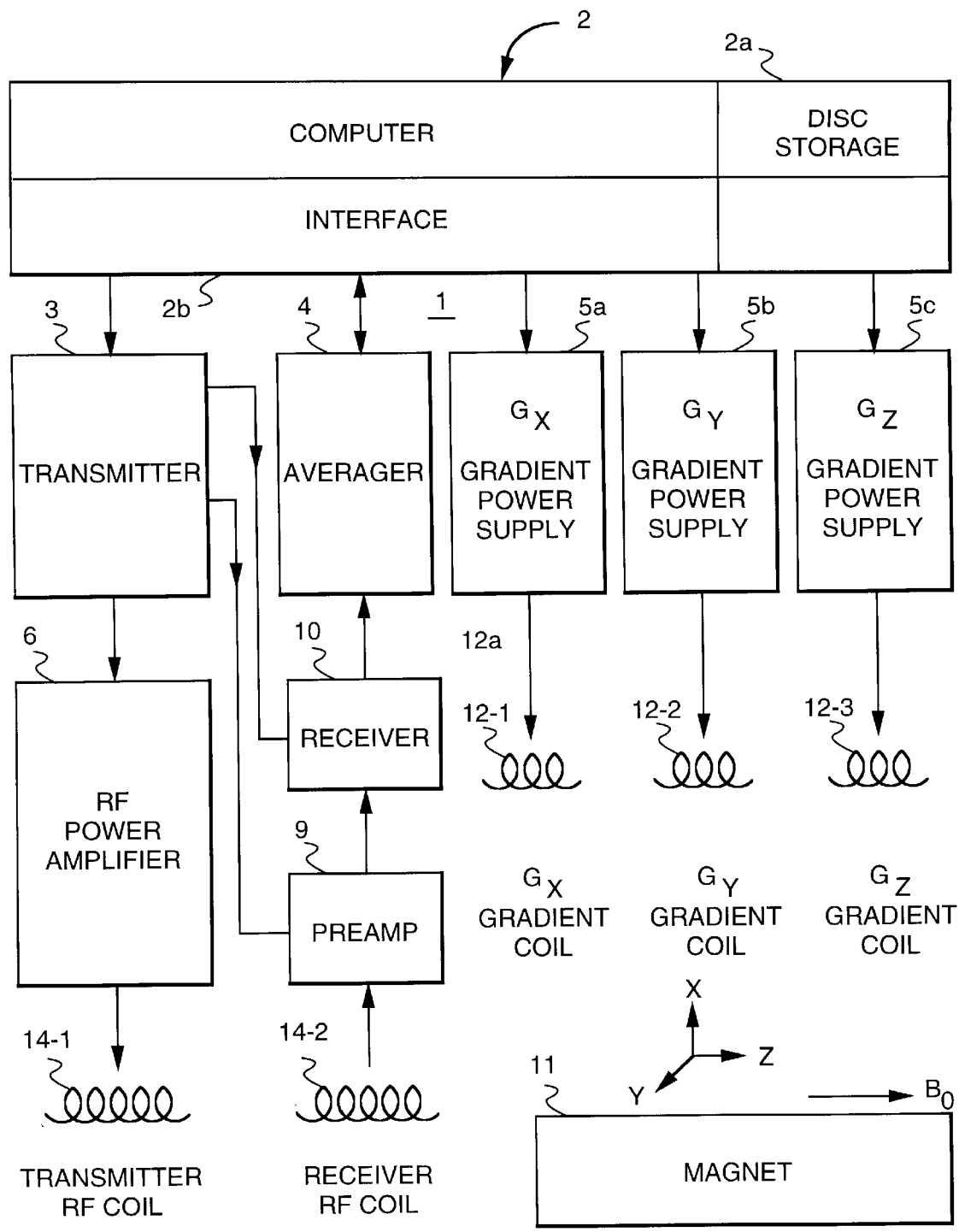
FIG. 1 is a simplified block diagram of a magnetic resonance (MR) imaging device which may be used with the present invention.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients $G_x$, $G_y$, $G_z$, respectively, in the "X", "Z" directions, respectively, over a subject to be imaged. RF transmitter 3 is gated with pulse envelopes from computer 2 to generate RF pulses having the required modulation to excite an MR response signal from a subject. The RF pules are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified in a low noise preamplifier 9 and passed to receiver 10 for further amplification, detection, and filtering. In alternative embodiments, there are a plurality of receiver coils 14-2, each connected to a low noise preamplifier by a lead cable, and each preamplifier is coupled to its own receiver.

The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

In some MR systems, transmitter coil 14-1 and receiver RF coil 14-2 may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an RF shielded cage.

Magnetic field gradient coils 12-1, 12-2, and 12-3 are necessary to provide gradients $G_x$, $G_y$, and $G_z$, respectively, that are monotonic and linear over the sample volume. Multivalued gradient fields cause a degradation in the MR response signal data, known as aliasing, which leads to severe image artifacts. Nonlinear gradients cause geometric distortions of the image.

In Magnetic Resonance (MR) imaging, the receive coil 14-2 of the MR imaging device of FIG. 1 collects an MR response signal generated by regions of the subject. A higher signal-to-noise (S/N) ratio results when receive coil 14-2 is a surface coil which conforms to the surface of the subject, and is held in the same place during imaging.

A smaller surface coil also provides higher resolution than a larger surface coil imaging the same region. Therefore, if one would desire a larger field of view, with high resolution, several surface coils, or an array of receive coils, may be used. Each receive coil would require its own receiver and cable connecting it to the receiver. This produces several problems. First, each cable interacts with the magnetic field thereby reducing the signal-to-noise ratio.

Also, each coil induces currents in adjacent coils, causing "coupling". Coupling of coils results in a different impedance of the coils causing the coils to be tuned to receive a frequency band slightly different than it was intended, or "detuned". This detuning causes a lower S/N ratio and therefore lower image quality. It is therefore desirable to tune an array of receive coils to a desired frequency for high quality imaging.

One such method of tuning multiple coils is to overlap a portion of each coil such that the net inductance of the coils is zero. This roughly equates to the magnetic flux passing through a portion of the coil which is not overlapped by the other coil being equal to the flux passing through the overlap portions of the coil.

This method of overlapping coils to decouple them has been used in other receive coil arrays which were fixed on a rigid material and not intended to be wrapped around the surface of the subject. As the coils are wrapped around the surface, the flux through the coils changes, therefore detuning the array.

Also, since there are several coils used, there are several independent cables which are connected to the coils therefore causing additional de-tuning and a reduction in the signal-to-noise ratio.

It would be very desirable to isolate each of the coils from the cable and each other such that there is little or no coupling.

Looking at the clinical aspects of MR imaging, a MR imaging device is used to image different anatomy of different subjects as they are treated in a clinic. Therefore the receive coils must be changed for each specific use, as in the Lenkinski et al. patent above. It is cumbersome and time consuming to repeatedly change these receive coils. Each time the coils are changed, the resonance frequency may also be adjusted.

If one were able to use a modular set of coils to image various regions of the subject, it would be beneficial. The present invention provides several modular groups of coils which may be interlinked to provide a single receive coil array or may be attached in smaller groups to different portions of the subject in a non-connected fashion.

Figure 2:
FIG. 2 is one embodiment of interconnected receive coil modules of the present invention used in imaging a subject's head.

FIG. 2 shows the subject wearing a tight fitting holder 11, which may resemble a tight fitting diving hood, having (4) flexible receive coil modules 13–19 each containing a receive coil 14-2 of FIG. 1. In FIG. 2, the receive coils are attached to each other in an interconnected fashion.

Note that with the present invention, a single set of modules can be fitted to the subject with a variety of geometries. For example, the same set of coils can be used to provide a linear, square, cylindrical and partially cylindrical array.

Holder 11 may resemble any other tight-fitting clothing depending on the anatomy desired to be imaged. Holders may resemble a shirt, vest, jacket, pants, shorts, socks, bra, etc. Holders 11 may also resemble portions of garments or be straps or belts. All that is requires is that they fit closely to the surface of the subject. The interconnected receive coil modules 13–19 are attached to the diving hood holder 11 and conform to the surface of the subject's head.

It is best if the modules 13–19 and the holder 11 easily attach to each other, such as the different materials used in Velcro, where the holder is constructed of one material and each flexible module 13–19 is constructed of the material which connects to the holder material.

The modules 13–19 may also be held by attachment means, such as a Velcro-type attachments, snaps, clips or similar attachment means, to holder 11. Any attachment means must utilize a non-magnetic and preferably a non-conductive material as much as possible to reduce their impact on interference with the imaging magnetic fields.

It should be noted that with the present invention, holder 11 and receive modules 13–19 may be fitted on the subject prior to placement of the subject in the MR scanner, thereby increasing the efficiency of uses of the scanner.

Receive coils 14-2 are made of conducting wire having an LRC with resonance consistent with the Larmor frequency of the nuclei being imaged and the imaging magnet used. For example, the coil array 13–19 should have a resonance frequency of 63.86 MHz matching the Larmor frequency of resonant water nuclei in a 1.5 Tesla MR imaging magnet.

In FIG. 3, a receive coil module 11 according to the present invention is shown. One or more coils are disposed on, or embedded in a flexible base 12, and may be attached in an overlapped fashion to minimize mutual inductance. Each module has attachment means, such as notches 17, 19, 21, 23, which meet with attachment means in another module, such as module 15 to connect them so the coils overlap by a predetermined amount. The overlap for zero mutual inductance can be precomputed by an empirical method, or can be geometrically calculated to determine the location of the attachment means. The magnetic flux passing through region "A" of FIG. 3 caused by module 15 should equal the magnetic flux through region "B" also caused by module 15. This determines the amount of overlap. It may also be noted that a module 25 may have several receive coils 20, 21, 23 arranged on a flexible base 27, such as shown in FIG. 4. These flexible modules may also be interconnected.

Since the attachment means are modular, they may have several modules which may be attached in several different ways to fit to different anatomy. They may also be placed on the subject without being attached to each other. For example, two coils may be on the subject's back, three on the stomach, and one on the side.

In an alternative embodiment, a balance-unbalanced ("balun") connection device is employed which couples balanced input leads to unbalanced output leads, blocking unwanted DC components and passes the remainder of the signal.

A simplified schematic of a general balun is shown in FIG. 5. It is typically one inductor 35 with one "floating" lead 31 and a second, grounded lead 33, which induces a current in a second inductor 45 having two "floating leads" 41, 43. Since there is no direct connection between the four leads, there is no transmission of the DC component of the signal. This effectively isolates each coil from resonance effects of the cable, and electronics connected to the cable. These type of baluns are described in "MRI Basics and Coil Design Principles" by D. M. Peterson, G. R. Duensing, J. R. Fitzsimmons, pp. 56–64, RF Design, January 1997.

Baluns may be used which have variable tuning so that only a narrow frequency band passes from the first set of leads to the second set of leads. These tunable baluns may be used with the present invention causing an increase in the S/N ratio.

If baluns are used, it is important to locate them as close to the coil as possible. In the past, baluns were connected between the receiver and the cable, to isolate the cable from the receiver. It was considered detrimental to use a balun between the cable and receive coil, since adding a balun would lower the quality factor ("Q") of the coil, believed to reduce the signal-to-noise ratio.

The present invention does just that, it employs a tuned balun between each receive coil and each cable. This does lower the Q of the coil, however, the isolation of the cables and the reduction in coupling between receive coils results in a significantly higher S/N ratio, and a more robust set of coils and higher quality images.

While several presently preferred embodiments of the present novel invention have been described in detail herein, many modifications and variations will now become apparent to those skilled in the art. It is our intent therefore, to be limited only by the scope of the appending claims and not by the specific details presented by way of illustration.

What we claim is:

1. An interlocking surface coil system for use with an MR imaging system comprising:

a first conductive coil tuned to receive MR response signals;

an interlocking flexible base for carrying the conductive coil;

connection means attached to the interlocking flexible base at predetermined locations such that a second interlocking flexible base carrying a second conductive coil is attached to the connection means such that there is a predetermined degree of coil overlap, thereby reducing interaction between coils.

2. The interlocking surface coil system of claim 1 further comprising:

a pair of lead wires attached to said first conductive coil;

a tuned balun attached between the first conductive coil and the lead wires located as close as possible to the first conductive coil for eliminating frequencies except for a narrow predefined desired band thereby reducing "coupling" between said first and second coils, and minimizing noise introduced by the lead wires.

3. The interlocking surface coil of claim 1 wherein the connection means is one of the group consisting of:

interlocking notches, snaps, clips, straps, belts and Velcro constructed of a non-ferromagnetic materials.

* * * * *